US006110800A

United States Patent [19]

Chou

[11] Patent Number: 6,110,800

[45] Date of Patent: Aug. 29, 2000

[54] METHOD FOR FABRICATING A TRENCH ISOLATION

[75] Inventor: Kuo-Yu Chou, Hsinchu, Taiwan

[73] Assignee: Winbond Electronics Corp., Hsinchu, Taiwan

[21] Appl. No.: 09/174,392

[22] Filed: Oct. 14, 1998

[30] Foreign Application Priority Data

Sep. 19, 1998 [TW] Taiwan ................................ 87115633

[51] Int. Cl.[7] ..................................................... H01L 21/76

[52] U.S. Cl. .......................... 438/431; 438/432; 438/435; 438/427

[58] Field of Search .................................... 438/431, 430, 438/432, 435, 424, 427

[56] References Cited

U.S. PATENT DOCUMENTS 4,471,525 9/1984 Sasaki ..................................... 438/431

*Primary Examiner*—John F. Niebling
*Assistant Examiner*—John Murphy
*Attorney, Agent, or Firm*—Jiawei Huang; J.C. Patents

[57] ABSTRACT

A method to form a shallow trench isolation (STI) structure includes forming a trench on a semiconductor substrate. Then a channel stop is formed under the trench. A pad oxide layer and a silicon nitride layer are sequentially formed over the substrate. A side-wall spacer is formed over the silicon nitride layer on each side of the trench. An oxidation process is performed to oxidize the side-wall spacer. Another side-wall spacer and oxidation are repeatedly performed until the trench is filled with oxide. An oxide layer is formed over the substrate. Then an active ion etching process is performed to remove the layers above the substrate other than the trench region. The STI structure then is formed.

32 Claims, 6 Drawing Sheets

222b
222a
210
208
205
200

METHOD FOR FABRICATING A TRENCH ISOLATION

CROSS-REFERENCE TO RELATED APPLICATION

This application claims the priority benefit of Taiwan application Ser. No. 87115633, filed Sep. 19, 1998, the full disclosure of which is incorporated herein by reference.

BACKGROUND OF THE INVENTION

1. Field of the Invention

This invention relates to a method of semiconductor fabrication, and more particularly to a method for fabricating an isolating structure in fabrication of an integrated circuit (IC) device.

2. Description of Related Art

The purpose of an isolation region in an IC device is to prevent a carrier from drifting between two adjacent device elements through a semiconductor substrate to cause a leakage. For example, carriers drift between two adjacent transistors through their substrate. Conventionally, isolation regions are formed between field effect transistors (FETs) in an IC device, such as a dynamic random access memory (DRAM) device, to prevent a current leakage from occurring. The isolation region usually includes a thick field oxide (FOX) layer formed directly on the substrate. For example, a local oxidation (LOCOS) process is a typical isolation process widely used for isolating a metal oxide semiconductor (MOS) transistor. The LOCOS technology has been well developed so that it can effectively isolate the MOS transistor or other kinds of device elements with a good reliability of performance. The fabrication cost thereby is reduced. However, the LOCOS technology still has some problems, for example, tensile stress related problems and an occurrence of bird's peak on the edge of an isolation structure, which is often seen in a FOX layer formed through the LOCOS technology.

As the device dimension is reduced in the IC device, the dimensions of active regions and the space between active regions are accordingly reduced as well. It causes to be thinner for a FOX layer formed by the LOCOS technology in this narrow space between active regions. The FOX layer thereby cannot effectively perform its isolation purpose. Moreover, during forming the FOX layer, a bird's peak occurs at the edge of the active region. Because the FOX layer and the active region include different materials, a gate oxide layer formed over the active region has a smaller thickness at the bird's peak edge due to the tensile stress. A current leakage thereby occurs on the gate oxide layer.

Shallow trench isolation (STI) is another widely used technology for isolating device elements. The STI process usually uses a silicon nitride layer as a mask to form a trench on the substrate by anisotropic etching. Then the trench is filled with an oxide material serving as an isolating structure, which has a top surface as high as the substrate surface. A MOS transistor is formed, for example, on the substrate between isolation structures at an active region. The MOS transistor over the active region includes two interchangeable source/drain regions on the substrate, a gate oxide layer, and a polysilicon gate over the gate oxide layer between the interchangeable source/drain regions. A channel region under the gate on the substrate is also formed. The depth of the STI structure determines the isolating effect. The STI structure can therefore be applied in a smaller device dimension.

FIGS. 1A–1D are cross-sectional views schematically illustrating a fabrication flow of a STI structure. In FIG. 1A, a pad oxide layer 11 and a silicon nitride layer 12 are sequentially formed over a semiconductor substrate 10. Then a photoresist layer 14 with a trench pattern is formed over the silicon nitride layer 12 by a photolithography process. Then, a trench 16 is formed by performing an anisotropic etching on the substrate 10 according to the trench pattern on the photoresist layer 14.

In FIG. 1B, after removing the photoresist layer 14, a thermal oxide layer 18 with a thickness of about between 300 Å and 500 Å is formed over the trench surface by thermal oxidation at a temperature of about between 900° C. and 1100° C. An oxide layer 20 is formed over the substrate 10 by, for example, atmospheric chemical vapor deposition (APCVD) with a reaction gas of tetra-ethyl-ortho-silicate (TEOS). The TEOS oxide layer 20 needs a densification process at a temperature of about between 900° C. and 1100° C. for about 10 to 30 minutes. In FIG. 1C, after the densification process, a chemical mechanical polishing (CMP) process is performed to polish the TEOS oxide layer 20 above the silicon nitride 12, which serves as a polishing stop layer. The residual TEOS oxide layer fills the trench 16 as an oxide plug 20*a*. The oxide plug 20*a* is used for isolation.

In FIG. 1D, the silicon nitride layer 12 and the oxide layer 11 are removed to expose the substrate 10. The top portion of the oxide plug 20*a* is also removed and becomes an oxide plug 20*b*. Next, a gate oxide layer (not shown) is formed by dry oxidation at an active region on the substrate 10, in which the active region is the region other than the oxide plug 20*b*. Then a polysilicon layer (not shown) is formed over the gate oxide layer by chemical vapor deposition (CVD). The polysilicon layer is doped by, for example, ion implantation and annealing or directly doped with dopant during CVD process. Then a gate structure including an oxide layer 22 and a doped polysilicon layer 24 as a gate are formed by photolithography and etching.

This conventional method described above needs the CMP process to remove the TEOS oxide layer 20. It causes a higher fabrication cost due to the CMP process itself and a low fabrication efficiency because the CMP process can polish only one wafer in each time.

SUMMARY OF THE INVENTION

It is therefore an objective of the present invention to provide a method to form a shallow trench isolation (STI) structure by filling the trench with oxide through multiple side-wall spacers intermediately formed on the trench sidewall. Then an active ion etching process is performed for planarization to form the STI structure. There is no need of a CMP process.

In accordance with the foregoing and other objectives of the present invention, a method to form a shallow trench isolation (STI) structure includes forming a trench on a semiconductor substrate by photolithography and etching. Then a channel stop is formed under the trench by, for example, ion implantation. A pad oxide layer and a silicon nitride layer are sequentially formed over the substrate. A side-wall spacer is formed over the silicon nitride layer on each side of the trench. An oxidation process is performed to oxidize the side-wall spacer. Another side-wall spacer and oxidation are repeatedly performed until the trench is filled with oxide. An oxide layer including, for example, borophosphosilicate glass (BPSG), phosphosilicate glass (PSG) or spin-on glass (SOG) is formed over the substrate to have more planar surface. Then an active ion etching process is performed to remove the oxide layer and the silicon nitride layer other than the trench region. After this anisotropic etching process, the trench is also planarized, and the residual oxide filled into the trench forms the STI structure.

In conclusion, the invention mainly utilizes an intermediate side-wall spacers repeatedly formed and oxidized on the side-wall of the trench in order to fill the trench with oxide. Then an oxide layer is formed over the substrate to have a better planar surface. Then the active ion etching process is performed to form and simultaneously planarize the STI structure without a CMP process, which has a higher fabrication cost and can only process one wafer in each time.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 1A:
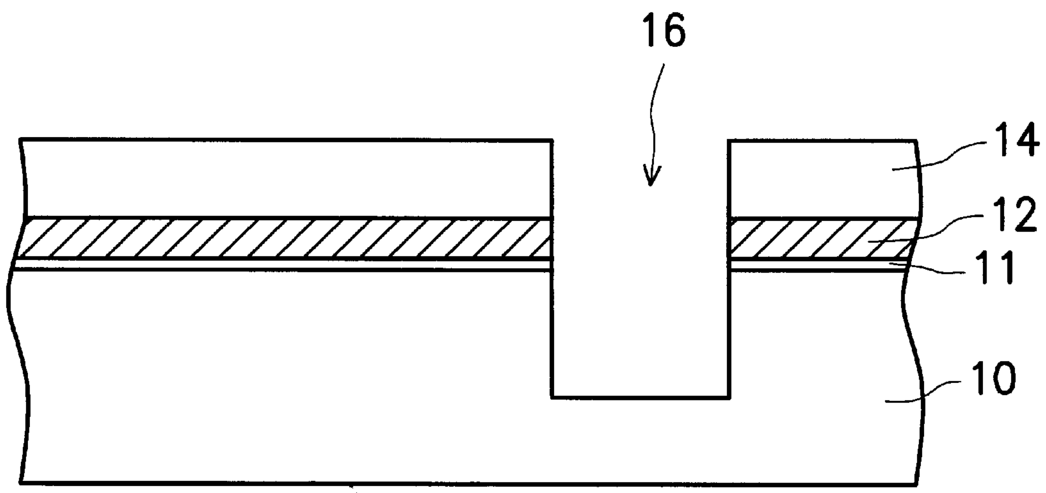
FIGS. 1A–1D are cross-sectional views schematically illustrating a conventional fabrication flow of a STI structure.
Figure 1B:
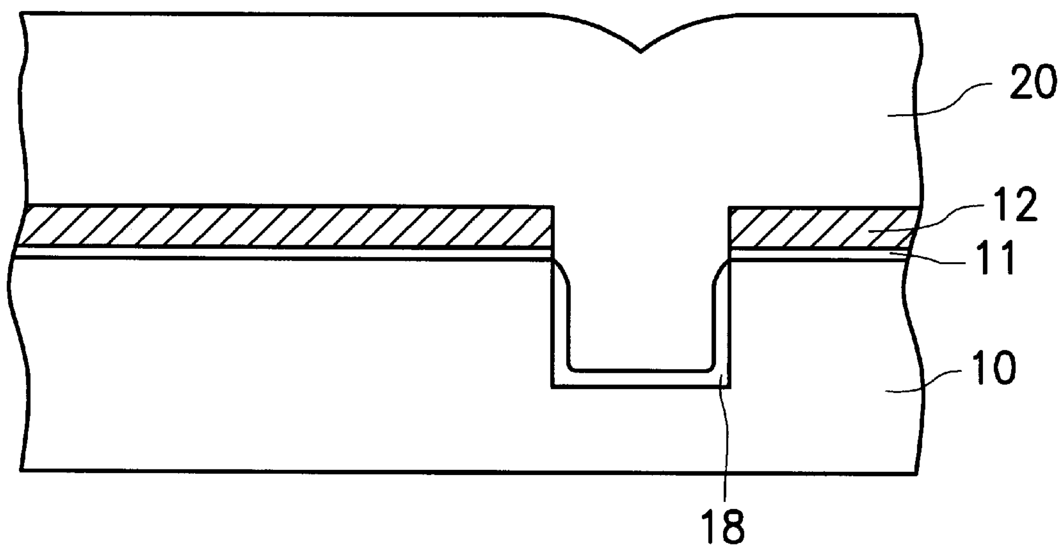
Figure 1C:
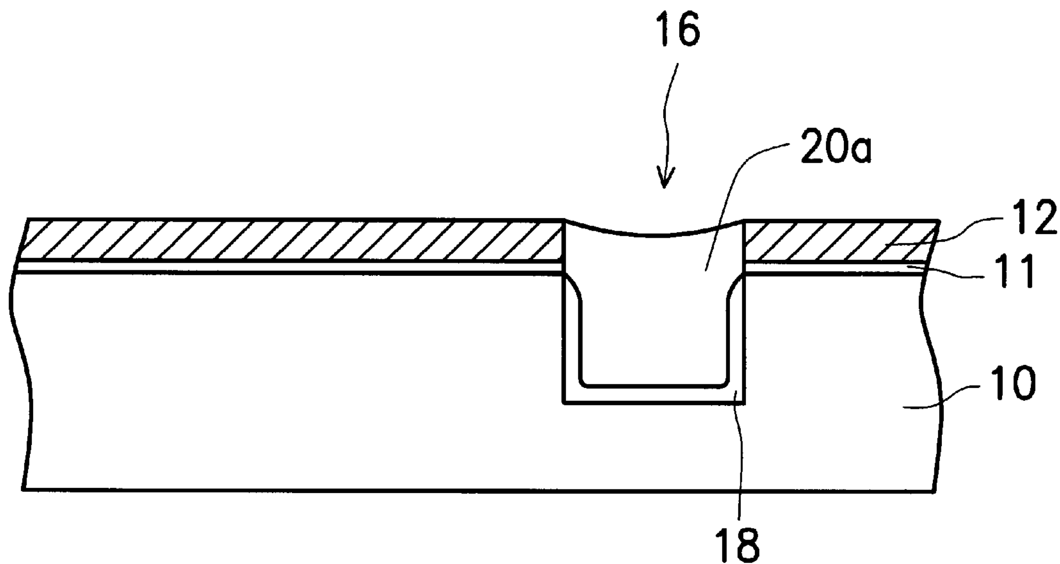
Figure 1D:
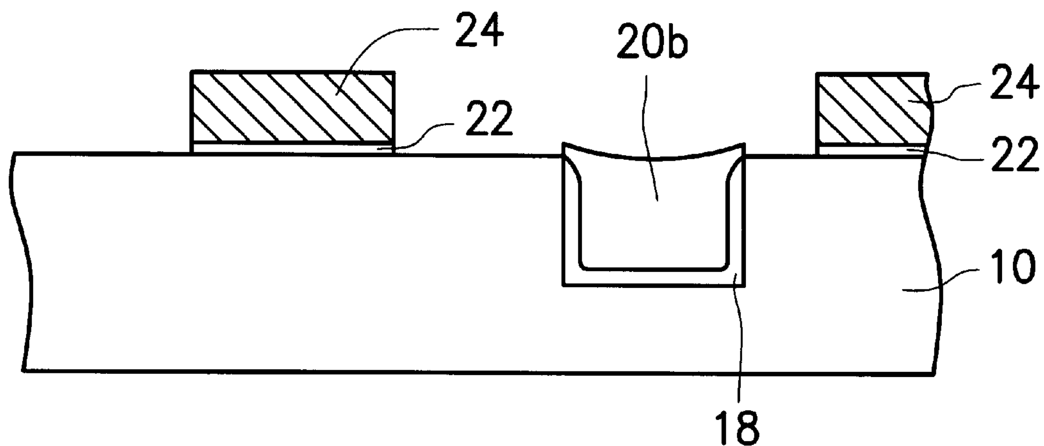
Figure 2A:
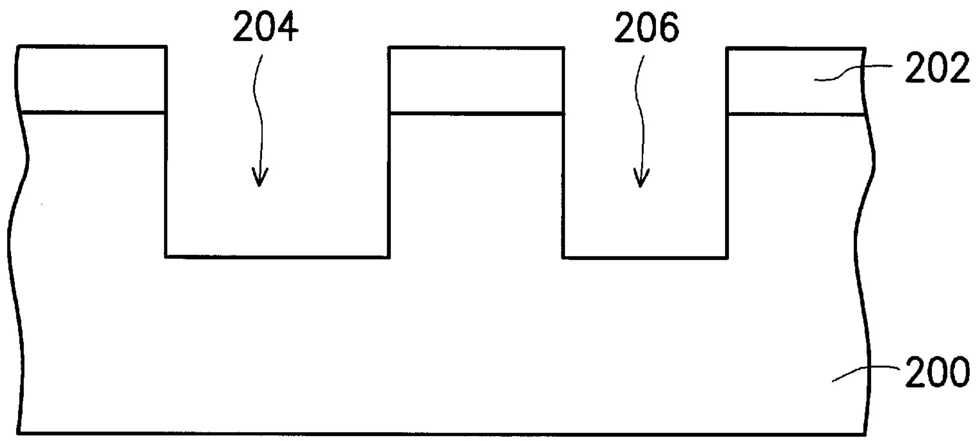
FIGS. 2A–2G are cross-sectional views schematically illustrating a fabrication flow of a STI structure, according to a preferred embodiment of the invention.

FIGS. 2A–2G are cross-sectional views schematically illustrating a fabrication flow of a STI structure, according to a preferred embodiment of the invention. In FIG. 2A, a photoresist layer 202 is formed over a semiconductor substrate 200. A photolithography process is performed to transfer a pattern onto the substrate 200. Then an anisotropic etching is performed to form a trench 204 and a trench 206 on the substrate, in which the depth of the trenches 204, 206 is about between 0.2 and 1.0 microns but the trench 204 is wider by a width of about between 0.8 and 1.0 microns and the trench 206 is narrower by a width about between 0.5 and 0.6 microns.

Figure 2B:
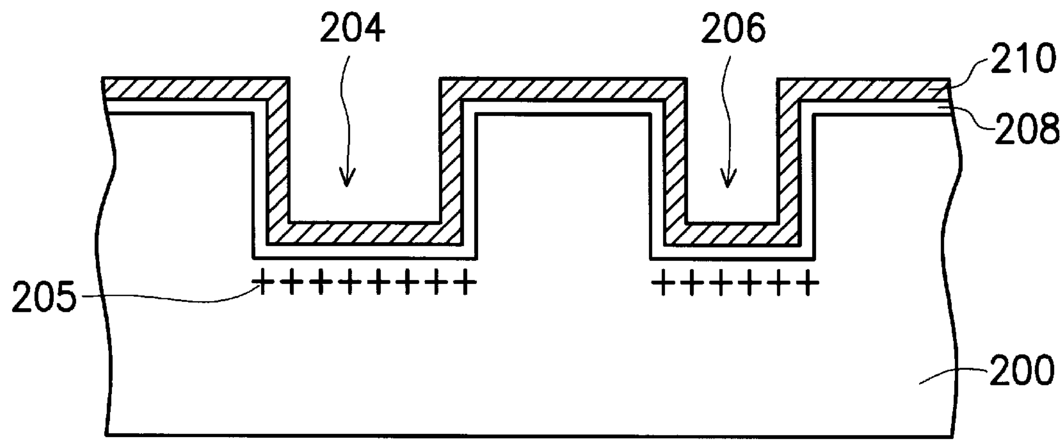

In FIG. 2B, an ion implantation process is performed to form a channel stop 205 under the trenches 204, 206, and then the photoresist layer 202 is removed. A pad oxide layer 208 and a silicon nitride 210 are sequentially formed over the substrate 200.

Figure 2C:
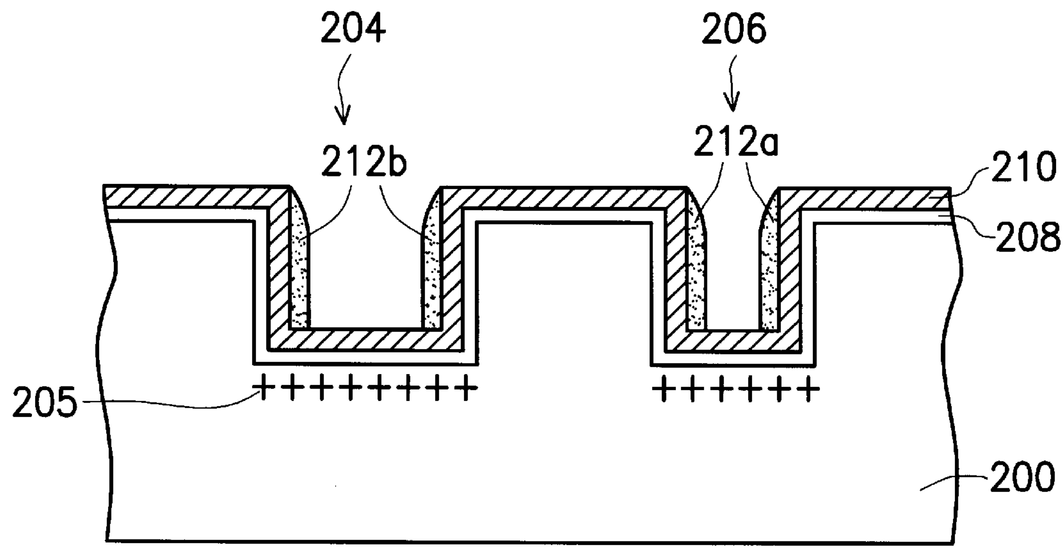

In FIG. 2C, a side-wall spacer 212*b* and a side-wall spacer 212*a* are respectively formed on each side the trench 204 and the trench 206 over the silicon nitride layer 210. The thickness of the side-wall spacers 212*a*, 212*b* is about between 0.1 and 0.2 microns. The formation includes, for example, depositing a polysilicon layer (not shown) over the substrate 200 through low pressure chemical vapor deposition (LPCVD) and performing an etching back process, such as an active ion etching process, to remove the polysilicon layer. The residual polysilicon is the side-wall spacers 212*a*, 212*b*. The etchant includes, for example, a $Cl_2$ gas or a mixed gas of $BCl_3/CCl_4$.

Figure 2D:
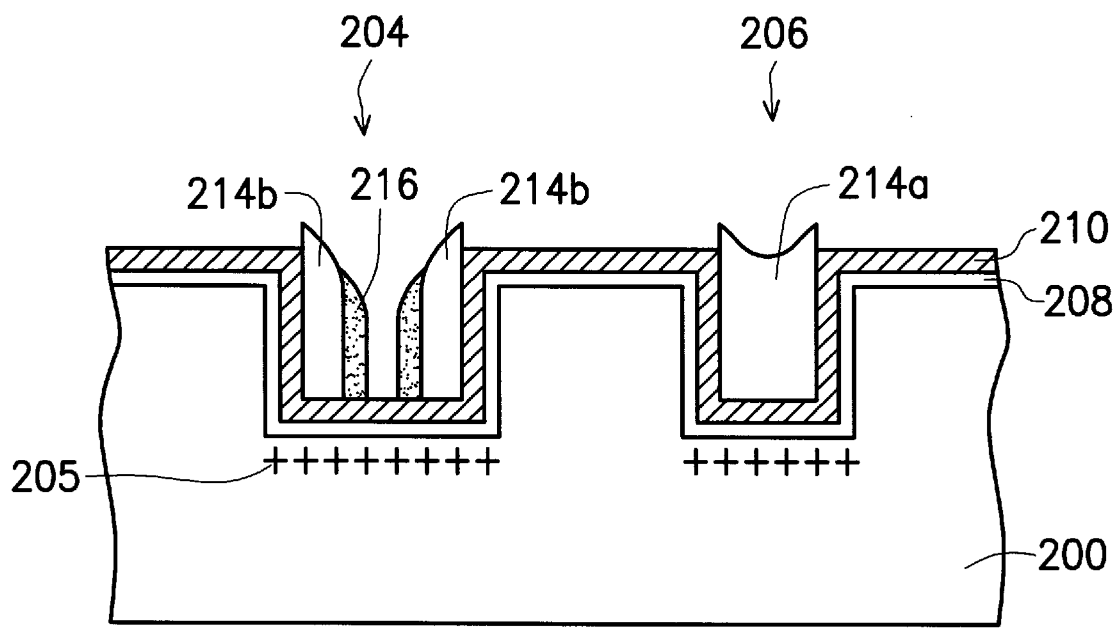
Figure 2E:
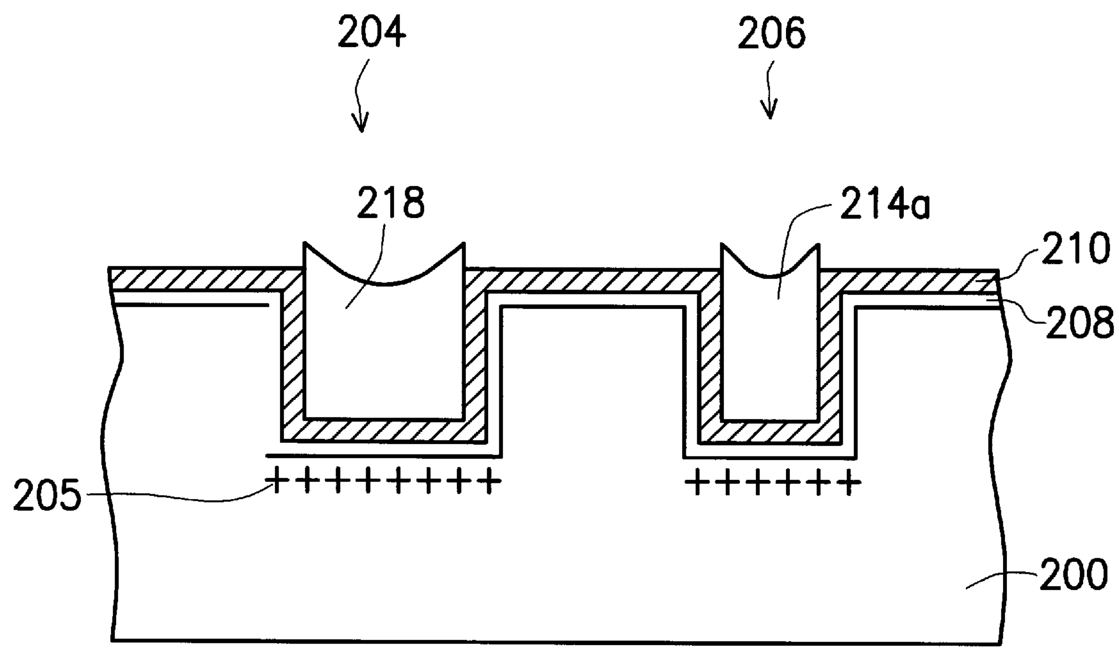

In FIG. 2C and FIG. 2D, an oxidation process, such as a wet oxidation process, is performed to oxidize the side-wall spacers 212*a*, 212*b*. Since the width of the trench 212*a* is narrow, after oxidation of the side-wall spacers 212*a*, an oxide plug 214*a* is formed to fill the trench 206. The trench 212*b* is wide, after oxidation of the side-wall spacer 212*b*, an oxide side-wall spacer 214*b* may be formed without fill filling the trench 204. In order to fully fill the trench 204 with oxide, another polysilicon side-wall spacer 216 can be repeatedly formed and oxidized as illustration in FIG. 2C until an oxide plug 218 is formed to fully fill the trench 204 as shown in FIG. 2E. The oxidation process to oxidize the side-wall spacer 216 or the subsequent side-wall spacers (not shown) is, for example, a wet oxidation process.

Figure 2F:
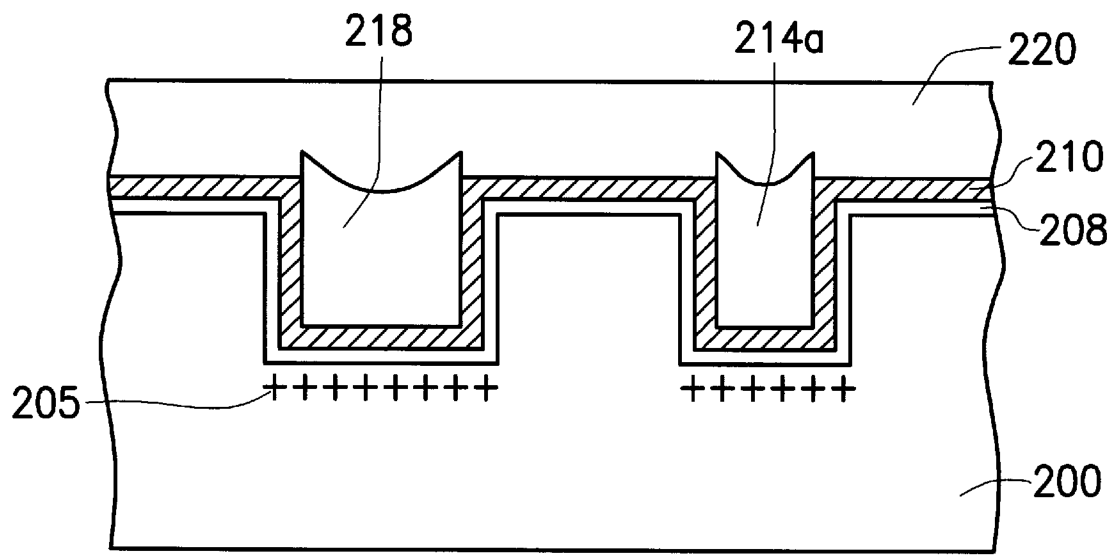

In FIG. 2F, an oxide layer 220 is formed over the substrate 200 to have a better planar surface. The oxide layer 220 includes, for example, borophosphosilicate glass (BPSG), phosphosilicate glass (PSG), or spin-on glass (SOG), and is formed by, for example, CVD.

Figure 2G:
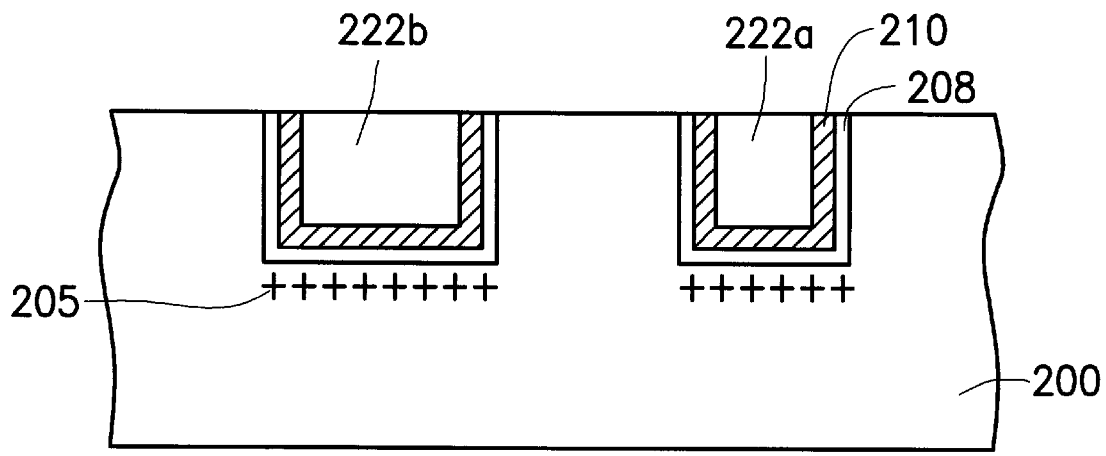

In FIG. 2G, an anisotropic etching process, such as an active ion etching process, is performed to remove a portion of the oxide layer 220, the silicon nitride layer 210, and the pad oxide layer 208 other than the trenches 204, 206 to expose the substrate 200. This etching process also planarizes the trenches 204, 206 so that the oxide plug 214*a* and the oxide plug 218 respectively become an oxide plug 222*a* and an oxide plug 222*b* to accomplish a STI structure on the trenches 204, 206. The STI structure has the top surface as high as the exposed substrate surface.

Figure 3A:
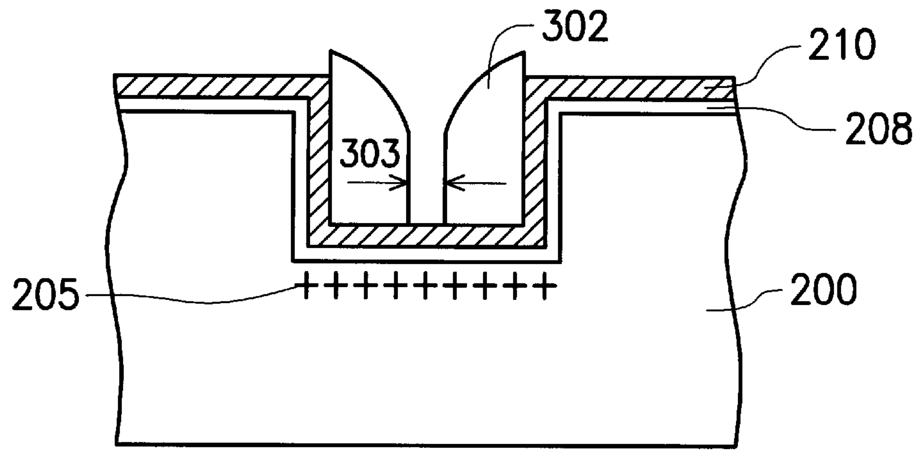
FIGS. 3A–3C are cross-sectional views schematically illustrating a formation flow of a possible residual polysilicon structure inside the STI trench, according to the preferred embodiment of the invention.
Figure 3B:
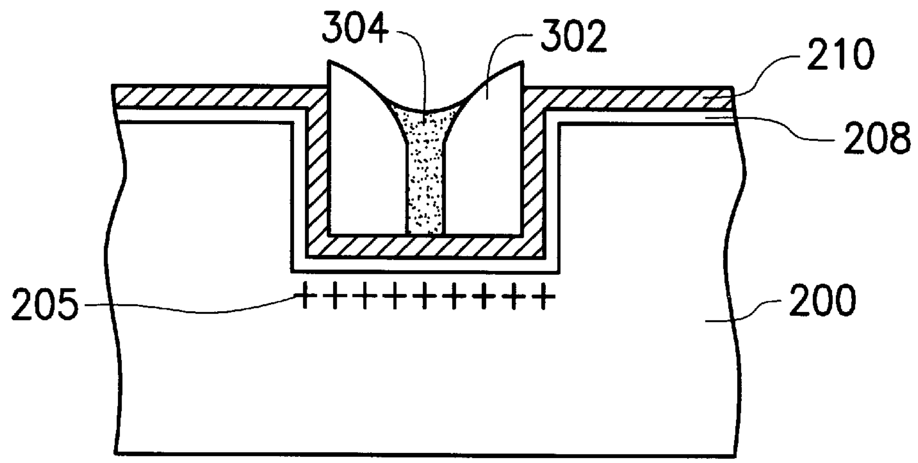
Figure 3C:
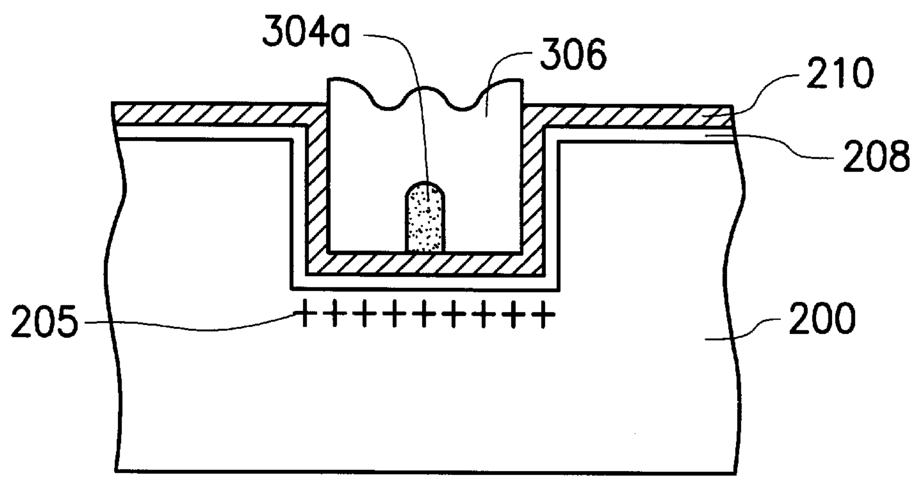

Furthermore, in order to form the oxide plug 218 shown in FIG. 2E, after few times of forming the side-wall spacers and oxidation processes described in FIG. 2D, it may appear that the clearance is not sufficient to allow a new side-wall spacer to be formed. A structure may be formed as shown in FIGS. 3A–3C, which are cross-sectional views schematically illustrating a formation flow of a possible residual polysilicon structure inside the STI trench. In FIG. 3A, following to the FIG. 2D, the oxide side-wall spacer 302 is formed with a small clearance 303 after a current oxidation process. The trench shown in FIG. 3A is, for example, the trench 204 in FIG. 2D. In FIG. 3B, since the clearance 303 is not sufficient for forming a new side-wall polysilicon spacer, a polysilicon plug 304 is formed instead during a subsequent process originally purposed to form the new side-wall polysilicon spacer. The polysilicon plug 304 thereby fills the clearance 303. In the repeating procedure described in FIG. 2D, a wet oxidation process is then performed to oxidize the polysilicon plug 304.

In FIG. 3C, an oxide plug 306 is formed to fill the trench. The polysilicon plug 304 becomes the polysilicon plug 304*a* enclosed by the oxide plug 306. This structure shown FIG. 3C also behaves the same isolation performance as the one without polysilicon plug 304*a*. The subsequent processes shown in FIGS. 2E–2G are performed, and then a STI structure is formed. The oxide plug 306 also includes a sufficient thickness for isolation performance.

In conclusion, one of characteristics of the invention is that the processes of LPCVD, etching back, and oxidation are used to repeatedly form and oxidize the intermediately side-wall spacers 212*a*, 212*b* on each side of the trenches 206, 204 until the trenches 206, 204 are fully filled by oxide. Then an active ion etching is performed to accomplish the STI structure. There is no need of a CMP process in the invention so that fabrication cost is reduced and the yield is increased.

Another characteristic of the invention is that the method can be simultaneously performed on several STI structures with different dimensions. This makes the fabrication be easier.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method to form a trench isolation structure, the method comprising:

forming a trench on a semiconductor substrate by photolithography and etching;

sequentially forming a pad oxide layer and a silicon nitride layer over the substrate;

forming a polysilicon side-wall spacer on each side of the trench;

oxidizing the polysilicon side-wall spacer to form an oxide side-wall spacer on each side of the trench;

repeating the step of forming the polysilicon side-wall spacer and the step of oxidizing it to form the oxide side-wall spacer until the oxide side-wall spacer fills the trench to form an oxide plug; and removing a portion of the pad oxide layer and the silicon nitride layer above the substrate other than the trench and a top portion of the oxide plug above the surface of the substrate.

2. The method of claim 1, wherein the trench has a thickness of about between 0.2 and 1.0 microns. 0.2 and 1.0 microns.

3. The method of claim 1, wherein the polysilicon side-wall spacer has a thickness of about between 0.1 and 0.2 microns.

4. The method of claim 1, wherein the step of forming the polysilicon side-wall spacer further comprises:

forming a polysilicon layer over the substrate; and performing an etching back process to remove the polysilicon layer and leave the polysilicon side-wall spacer on each side of the trench.

5. The method of claim 4, wherein the step of forming the polysilicon layer comprises low pressure chemical vapor deposition (LPCVD).

6. The method of claim 4, wherein the step of performing the etching back process comprises an active ion etching process.

7. The method of claim 1, wherein the step of oxidizing the polysilicon side-wall spacer comprises a wet etching process.

8. The method of claim 1, wherein after the trench is filled by the oxide plug through the step of repeating processes, a planar oxide layer is further formed over the substrate.

9. The method of claim 1, wherein the planar oxide layer comprises borophosphosilicate glass (BPSG).

10. The method of claim 1, wherein the planar oxide layer comprises phosphosilicate glass (PSG).

11. The method of claim 1, wherein the planar oxide layer comprises spin-on glass (SOG).

12. The method of claim 1, wherein the step of removing a portion of the pad oxide layer and the silicon nitride layer and a top portion of the oxide plug comprises an active ion etching.

13. A method to form a trench isolation structure, the method comprising:

forming a trench on a semiconductor substrate by photolithography and etching;

performing an ion implantation process to form a channel stop layer under the trench;

sequentially forming a pad oxide layer and a silicon nitride layer over the substrate;

forming a polysilicon side-wall spacer on each side of the trench;

oxidizing the polysilicon side-wall spacer to form an oxide side-wall spacer on each side of the trench;

repeating the step of forming the polysilicon side-wall spacer and the step of oxidizing it to form the oxide side-wall spacer until the oxide side-wall spacer fills the trench to form an oxide plug;

forming a planar oxide layer over the substrate by low pressure chemical vapor deposition (LPCVD); and performing an active ion etching process to remove a portion of the pad oxide layer and the silicon nitride layer above the substrate other than the trench and a top portion of the oxide plug above the surface of the substrate.

14. The method of claim 13, wherein the trench has a thickness of about between 0.2 and 1.0 microns.

15. The method of claim 13, wherein the polysilicon side-wall spacer has a thickness of about between 0.1 and 0.2 microns.

16. The method of claim 13, wherein the step of forming the polysilicon side-wall spacer further comprises:

forming a polysilicon layer over the substrate; and performing an etching back process to remove the polysilicon layer and leave the polysilicon side-wall spacer on each side of the trench.

17. The method of claim 16, wherein the step of forming the polysilicon layer comprises low pressure chemical vapor deposition (LPCVD).

18. The method of claim 16, wherein the step of performing the etching back process comprises an active ion etching process.

19. The method of claim 13, wherein the step of oxidizing the polysilicon side-wall spacer comprises a wet etching process.

20. The method of claim 13, wherein the planar oxide layer comprises borophosphosilicate glass (BPSG).

21. The method of claim 13, wherein the planar oxide layer comprises phosphosilicate glass (PSG).

22. The method of claim 13, wherein the planar oxide layer comprises spin-on glass (SOG).

23. A method to form a trench isolation structure, the method comprising:

forming a wide trench and a narrow trench on a semiconductor substrate by photolithography and etching, wherein the wide trench has a wider width than that of the narrow trench;

sequentially forming a pad oxide layer and a silicon nitride layer over the substrate;

forming a polysilicon side-wall spacer on each side of the wide trench and the narrow trench;

oxidizing the polysilicon side-wall spacer to form an oxide side-wall spacer on each side of the wide trench and the narrow trench;

repeating the step of forming the polysilicon side-wall spacer and the step of oxidizing it to form the oxide side-wall spacer until the oxide side-wall spacer fills the wide trench to form a wide oxide plug in the wide trench and a narrow oxide plug in the narrow trench; and removing a portion of the pad oxide layer and the silicon nitride layer above the substrate other than the trenches and a top portion of the oxide plugs above the surface of the substrate.

24. The method of claim 23, wherein the trenches have a thickness of about between 0.2 and 1.0 microns.

25. The method of claim 23, wherein the wide trench has a width of about between 0.8 and 1.0 microns.

26. The method of claim 23, wherein the narrow trench has a width of about between 0.5 and 0.6 microns.

27. The method of claim 23, wherein the polysilicon side-wall spacer has a thickness of about between 0.1 and 0.2 microns.

28. The method of claim 23, wherein the step of forming the polysilicon side-wall spacer further comprises:

forming a polysilicon layer over the substrate; and performing an etching back process to remove the polysilicon layer and leave the polysilicon side-wall spacer on each side of the trenches.

29. The method of claim 28, wherein the step of forming the polysilicon layer comprises low pressure chemical vapor deposition (LPCVD).

30. The method of claim 28, wherein the step of performing the etching back process comprises an active ion etching process.

31. The method of claim 23, wherein the step of oxidizing the polysilicon side-wall spacer comprises a wet etching process.

32. The method of claim 23, wherein the step of removing a portion of the pad oxide layer and the silicon nitride layer other than trenches and a top portion of the oxide plug comprises an active ion etching.

* * * * *